(12) United States Patent
Lee et al.

(10) Patent No.: US 12,505,993 B2
(45) Date of Patent: Dec. 23, 2025

(54) SEMICONDUCTOR FABRICATION FACILITY

(71) Applicant: SAMSUNG ELECTRONICS CO., LTD., Suwon-si (KR)

(72) Inventors: Jonghyun Lee, Seongnam-si (KR); Sungseung Lim, Yongin-si (KR); Yoodong Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 529 days.

(21) Appl. No.: 17/955,112

(22) Filed: Sep. 28, 2022

(65) Prior Publication Data
US 2023/0268166 A1 Aug. 24, 2023

(30) Foreign Application Priority Data

Feb. 22, 2022 (KR) ........................ 10-2022-0023128

(51) Int. Cl.
*H01J 37/32* (2006.01)
*C23C 16/44* (2006.01)
(Continued)

(52) U.S. Cl.
CPC ...... *H01J 37/3288* (2013.01); *C23C 16/4412* (2013.01); *C23C 16/52* (2013.01);
(Continued)

(58) Field of Classification Search
CPC ............ H01J 37/3288; H01J 37/32834; H01J 2237/24585; H01J 37/3244; H01J 37/32449; C23C 16/4412; C23C 16/52; C23C 16/50; C23C 16/45561; G01B 17/025; G01B 17/02; H01L 21/67017;
(Continued)

(56) References Cited

U.S. PATENT DOCUMENTS 5,575,853 A * 11/1996 Arami ................. C23C 16/4412
118/712
5,819,683 A * 10/1998 Ikeda ..................... B01D 53/72
118/724
(Continued)

FOREIGN PATENT DOCUMENTS

EP 1 743 142 B1 9/2019
JP 4-95706 A 3/1992
(Continued)

*Primary Examiner* — Rudy Zervigon
(74) *Attorney, Agent, or Firm* — Sughrue Mion, PLLC (57) ABSTRACT

Provided is a semiconductor fabrication facility including a chamber, a gas supply configured to provide reaction gas to the chamber, a plurality of vacuum pumps respectively configured to pump the reaction gas from the chamber, an exhaust apparatus that is connected to the plurality of vacuum pumps and configured to purify the reaction gas, an exhausting line between the exhaust apparatus and the plurality of vacuum pumps, a thickness detection apparatus connected to the exhausting line and configured to detect a thickness of a byproduct layer in the exhausting line, and a processor connected to the thickness detection apparatus and configured to display preventive maintenance of the exhausting line based on the thickness of the byproduct layer being greater than a threshold value.

20 Claims, 4 Drawing Sheets

(51) Int. Cl.
*C23C 16/52* (2006.01)
*G01B 17/02* (2006.01)
*C23C 16/50* (2006.01)

(52) U.S. Cl.
CPC ...... *G01B 17/025* (2013.01); *H01J 37/32834* (2013.01); *C23C 16/50* (2013.01); *H01J 2237/24585* (2013.01)

(58) Field of Classification Search
CPC ........ H01L 21/67253; H01L 21/67242; G01N 2291/02854
USPC ........................ 118/715; 156/345.33, 345.34
See application file for complete search history.

(56) References Cited

U.S. PATENT DOCUMENTS

| | | | |
|---|---|---|---|
| 5,837,094 A * | 11/1998 | Tsukazaki | H01L 21/67748 |
| | | | 204/298.31 |
| 6,568,271 B2 * | 5/2003 | Shah | G01N 29/11 |
| | | | 73/599 |
| 6,913,378 B2 * | 7/2005 | Ho | F21V 7/005 |
| | | | 362/346 |
| 7,104,127 B2 | 9/2006 | Perng et al. | |
| 9,091,638 B2 | 7/2015 | Frederick et al. | |
| 9,778,017 B2 | 10/2017 | Kim | |
| 2003/0010091 A1 * | 1/2003 | Mitchell | C23C 16/4408 |
| | | | 438/5 |
| 2003/0033870 A1 * | 2/2003 | Shah | G01N 29/449 |
| | | | 73/299 |
| 2003/0066483 A1 * | 4/2003 | Lee | C23C 16/4412 |
| | | | 438/758 |
| 2004/0144770 A1 * | 7/2004 | Kasai | C23C 16/52 |
| | | | 219/390 |
| 2005/0189074 A1 * | 9/2005 | Kasai | H01L 21/6831 |
| | | | 156/345.33 |
| 2007/0189356 A1 * | 8/2007 | Pettit | C23C 16/4412 |
| | | | 374/7 |
| 2008/0047578 A1 * | 2/2008 | Yoo | B08B 9/027 |
| | | | 134/1.1 |
| 2008/0148866 A1 | 6/2008 | Frohlich et al. | |
| 2010/0018311 A1 | 1/2010 | Batzinger et al. | |
| 2010/0166630 A1 * | 7/2010 | Gu | B01F 25/4521 |
| | | | 422/171 |
| 2012/0222813 A1 * | 9/2012 | Pal | C23C 16/4412 |
| | | | 156/345.31 |
| 2017/0008044 A1 * | 1/2017 | Okumura | H01L 21/67051 |
| 2017/0176165 A1 | 6/2017 | Kim | |
| 2022/0090263 A1 * | 3/2022 | Yahata | C23C 16/401 |
| 2022/0090951 A1 * | 3/2022 | Lilleland | G01N 17/008 |
| 2023/0307255 A1 * | 9/2023 | Deye | H01L 21/67017 |

FOREIGN PATENT DOCUMENTS

| | | |
|---|---|---|
| JP | 9-287937 A | 11/1997 |
| JP | 6912899 B2 | 8/2021 |
| KR | 10-2010-0129637 A | 12/2010 |
| KR | 10-1221619 B1 | 1/2013 |
| KR | 10-1379934 B1 | 4/2014 |
| KR | 10-1461227 B1 | 11/2014 |
| KR | 10-1664484 B1 | 10/2016 |
| KR | 10-2017-0061962 A | 6/2017 |

\* cited by examiner

SEMICONDUCTOR FABRICATION FACILITY

CROSS-REFERENCE TO RELATED APPLICATION

This application claims priority to Korean Patent Application No. 10-2022-0023128 filed on Feb. 22, 2022 in the Korean Intellectual Property Office, the disclosure of which is hereby incorporated by reference in its entirety.

BACKGROUND

Embodiments of the present disclosure relate to a semiconductor fabrication facility, and more particularly, to a semiconductor fabrication facility in which a film deposition process or an etching process is performed.

In general, a semiconductor device may be formed by unit processes. The unit processes may include a film deposition process, a photolithography process, and an etching process. Among the processes, the film deposition process and the etching process may be perfumed at vacuum state whose pressure is less than atmospheric pressure. For example, the film deposition process and the etching process may be mainly executed in a chamber. A reaction gas and air in the chamber may be pumped by vacuum pumps. The reaction gas may be provided through an exhausting line to an exhaust device. The exhausting line may be cleaned or replaced through preventive maintenance.

SUMMARY

One or more embodiments of the present disclosure provide a semiconductor fabrication facility capable of executing preventive maintenance on an exhausting line.

According to an aspect of an embodiment, there is provided a semiconductor fabrication facility including a chamber, a gas supply configured to provide reaction gas to the chamber, a plurality of vacuum pumps respectively configured to pump the reaction gas from the chamber, an exhaust apparatus that is connected to the plurality of vacuum pumps and configured to purify the reaction gas, an exhausting line between the exhaust apparatus and the plurality of vacuum pumps, a thickness detection apparatus connected to the exhausting line and configured to detect a thickness of a byproduct layer in the exhausting line, and a processor connected to the thickness detection apparatus and configured to display preventive maintenance of the exhausting line based on the thickness of the byproduct layer being greater than a threshold value.

According to another aspect of an embodiment, there is provided a semiconductor fabrication facility including a chamber, a gas supply configured to provide reaction gas to the chamber, a high-vacuum pump connected to the chamber, a low-vacuum pump connected to the high-vacuum pump, a foreline connecting the low-vacuum pump and the high-vacuum pump to the chamber, a roughing line connecting the low-vacuum pump to the chamber, an exhaust apparatus connected to the low-vacuum pump and configured to purify the reaction gas, an exhausting line between the exhaust apparatus and the low-vacuum pump, a thickness detection apparatus connected to the exhausting line and configured to detect a thickness of a byproduct layer in the exhausting line, and a processor connected to the thickness detection apparatus and configured to display preventive maintenance of the exhausting line based on the thickness of the byproduct layer being greater than a threshold value.

According to another aspect of an embodiment, there is provided a semiconductor fabrication facility including a chamber including a showerhead, a gas supply connected to the showerhead and configured to provide reaction gas to the chamber, an exhaust apparatus configured to exhaust and purify the reaction gas, an exhausting line between the exhaust apparatus and the chamber, and a thickness detection apparatus connected to the exhausting line and configured to detect a thickness of a byproduct layer in the exhausting line, wherein the thickness detection apparatus includes a first thickness detector provided in a direction perpendicular to a direction in which the exhausting line extends, the first thickness detector being configured to provide the exhausting line with a first ultrasonic wave to detect the thickness of the byproduct layer, and a second thickness detector provided on a side of the exhausting line opposite to the first thickness detector, the second thickness detector being configured to provide the exhausting line with a second ultrasonic wave to re-detect the thickness of the byproduct layer.

BRIEF DESCRIPTION OF DRAWINGS

The above and other objects and features of the present disclosure will become apparent by describing in detail embodiments thereof with reference to the accompanying drawings.

DETAIL PORTIONED DESCRIPTION OF EMBODIMENTS

Below, embodiments of the present disclosure may be described in detail and clearly to such an extent that an ordinary one in the art easily implements the present disclosure. Embodiments described herein are example embodiments, and thus, the disclosure is not limited thereto.

Figure 1:
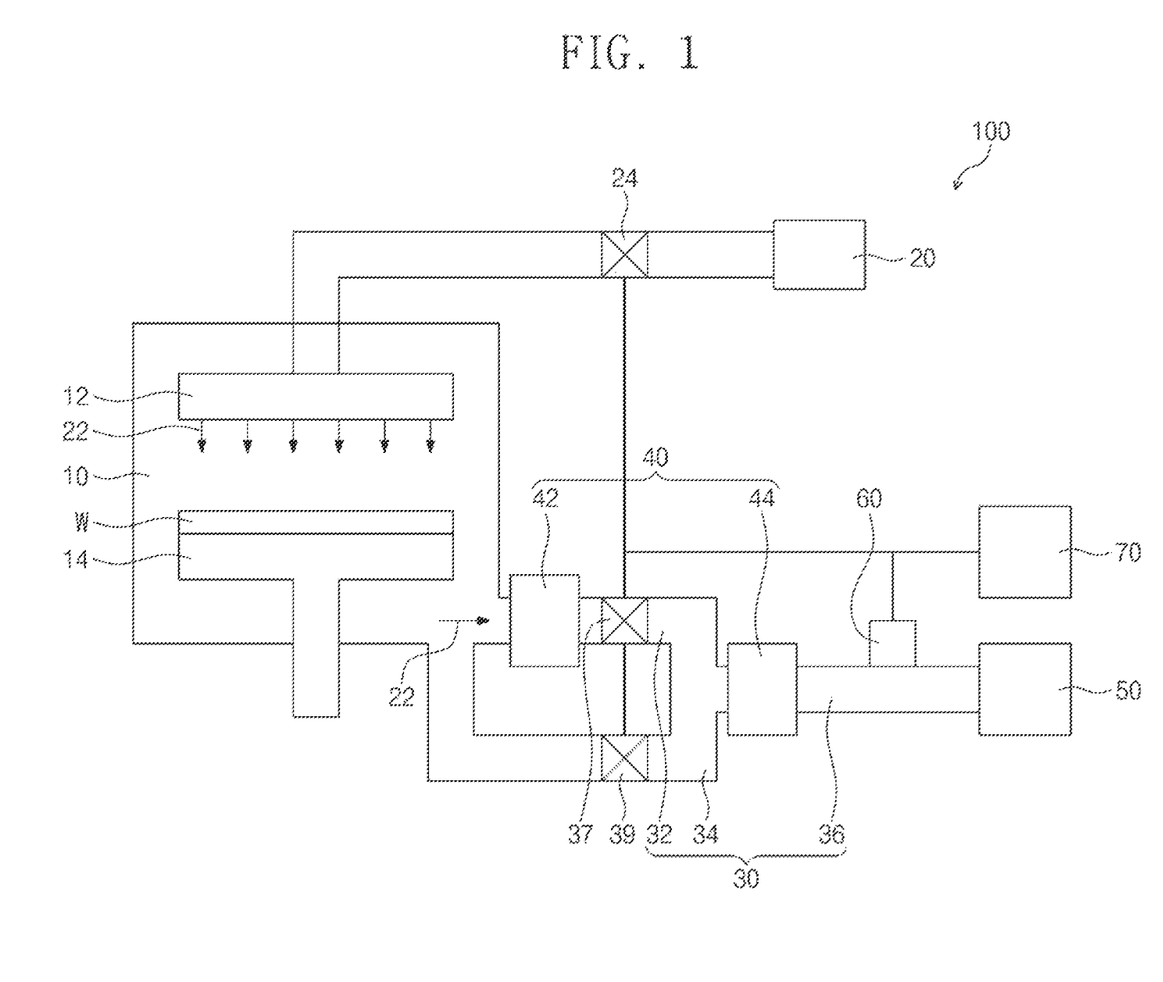
FIG. 1 illustrates a schematic diagram showing an example of a semiconductor fabrication facility according to an embodiment.

FIG. 1 shows an example of a semiconductor fabrication facility 100 according to an embodiment.

Referring to FIG. 1, the semiconductor fabrication facility 100 according to the embodiment may include a film deposition apparatus or a dry etching apparatus. According to the embodiment, the semiconductor fabrication facility 100 may include a chamber 10, a gas supply 20, a pumping line 30, vacuum pumps 40, an exhaust apparatus 50, a thickness detection apparatus 60, and a controller 70.

The chamber 10 may include a substrate W with a hermetically sealed space. According to an embodiment, the chamber 10 may have a showerhead 12 and a susceptor 14. The showerhead 12 may be disposed in an upper portion of the chamber 10. The showerhead 12 may be connected to the gas supply 20. The showerhead 12 may provide the substrate W with a reaction gas 22 to deposit a thin film. According to another embodiment, the reaction gas 22 may etch the substrate W, but embodiments are not limited thereto. The susceptor 14 may be disposed in a lower portion of the chamber 10. The susceptor 14 may receive the substrate W thereon. The susceptor 14 may include a heater plate which heats the substrate W. The susceptor 14 may include a chuck that fixes the substrate W, but embodiments are not limited thereto. A power supply may be connected to the showerhead 12 and the susceptor 14. The power supply may provide the showerhead 12 and the susceptor 14 with a radio-frequency power to excite the reaction gas 22 into a plasma state.

The gas supply 20 may be connected to the showerhead 12 provided in the chamber 10. The gas supply 20 provide the showerhead 12 with the reaction gas 22 to deposit a thin film on the substrate W. The reaction gas 22 may include a precursor of an inorganic or organic material. According to another embodiment, the reaction gas 22 may include, for example, an acid gas, a purge gas, a hydrogen gas, or a helium gas, but embodiments are not limited thereto. After deposition or etching of a thin film on the substrate W, the reaction gas 22 may be exhausted through the pumping line 30, the vacuum pumps 40, and the exhaust apparatus 50.

A flow control valve 24 may be provided between the gas supply 20 and the chamber 10. The flow control valve 24 may control a flow rate of the reaction gas 22 provided to the chamber 10.

The pumping line 30 may be connected to a lower portion of the chamber 10. The pumping line 30 may connect the vacuum pumps 40 and the exhaust apparatus 50 to the chamber 10. The pumping line 30 may exhaust the reaction gas 22 through the vacuum pumps 40 and the exhaust apparatus 50. The reaction gas 22 in the pumping line 30 may be a gas after reaction (or post-reaction gas). The pumping line 30 may include a tube of plastic or metal such as a stainless steel (SUS), but embodiments are not limited thereto. According to an embodiment, the pumping line 30 may include a foreline 32, a roughing line 34, and an exhausting line 36. The foreline 32 may connect the vacuum pumps 40 in series to the chamber 10. The roughing line 34 may detour one (e.g., a high-vacuum pump 42) of the vacuum pumps 40 to connect another (e.g., a low-vacuum pump 44) to the chamber 10. The exhausting line 36 may connect the vacuum pumps 40 to the exhaust apparatus 50.

The vacuum pumps 40 may be connected to the chamber 10 through the foreline 32 and the roughing line 34. The vacuum pumps 40 may pump the reaction gas 22 and air from the chamber 10. According to an embodiment, the vacuum pumps 40 may include a high-vacuum pump 42 and a low-vacuum pump 44.

The high-vacuum pump 42 may be provided between the low-vacuum pump 44 and the chamber 10. The high-vacuum pump 42 may be connected to the foreline 32. The high-vacuum pump 42 may be configured such that the reaction gas 22 and air in the chamber 10 are pumped at a high vacuum pressure of about $1.0 \times 10^{-6}$ Torr. The high-vacuum pump 42 may include a cryo pump or turbo pump.

A foreline valve 37 may be provided on the foreline 32 between the high-vacuum pump 42 and the low-vacuum pump 44. The foreline valve 37 may be closed when the high-vacuum pump 42 does not operate.

The low-vacuum pump 44 may be connected and provided between the foreline valve 37 and the exhausting line 36. The low-vacuum pump 44 may be configured such that the reaction gas 22 and air in the chamber 10 are pumped at a low vacuum pressure of about $1.0 \times 10^{-3}$ Torr. The low-vacuum pump 142 may include a dry pump or rotary pump.

A roughing valve 39 may be provided on the roughing line 34 between the low-vacuum pump 44 and the chamber 10. The roughing valve 39 may operate opposite to the foreline valve 37. When the foreline valve 37 is closed and the roughing valve 39 is opened, the low-vacuum pump 44 may pump air from the chamber 10 to leave behind a low vacuum. When the foreline valve 37 is opened and the roughing valve 39 is closed, the high-vacuum pump 42 and the low-vacuum pump 44 may pump air from the chamber 10 to leave behind a high vacuum.

The exhaust apparatus 50 may be connected to a distal end of the exhausting line 36. The exhaust apparatus 50 may be configured such that the reaction gas 22 and air in the chamber 10 are exhausted to the atmosphere or the outside of semiconductor production line. The exhaust apparatus 50 may purify the reaction gas 22 by trapping fine particles in the reaction gas 22. For example, the exhaust apparatus 50 may include a scrubber.

The thickness detection apparatus 60 may be provided on the exhausting line 36. The thickness detection apparatus 60 may detect a thickness T of a byproduct layer 38 (FIG. 2) in the exhausting line 36. For example, the thickness detection apparatus 60 may include an ultrasonic sensor.

The controller 70 may be connected to the flow control valve 24, the foreline valve 37, the roughing valve 39, and the thickness detection apparatus 60. The controller 70 may control a supply flow rate of the reaction gas 22 and also control a pump or exhaust flow rate of the reaction gas 22. The controller 70 may be configured such that a thickness detection signal of the thickness detection apparatus 60 is used to determine the thickness T of the byproduct layer 38 in the exhausting line 36.

The controller 70 may include a computing device such as a workstation computer, a desktop computer, a laptop computer, or a tablet computer. The controller may include a simple controller, a microprocessor, a complex processor such as a central processing unit (CPU) or a graphics processing unit (GPU), a processor configured by software, or dedicated hardware or firmware. For example, the controller and the processor may be implemented by a general-use computer or an application-specific hardware component such as a digital signal processor (DSP), a field programmable gate array (FPGA), or an application-specific integrated circuit (ASIC).

Figure 2:
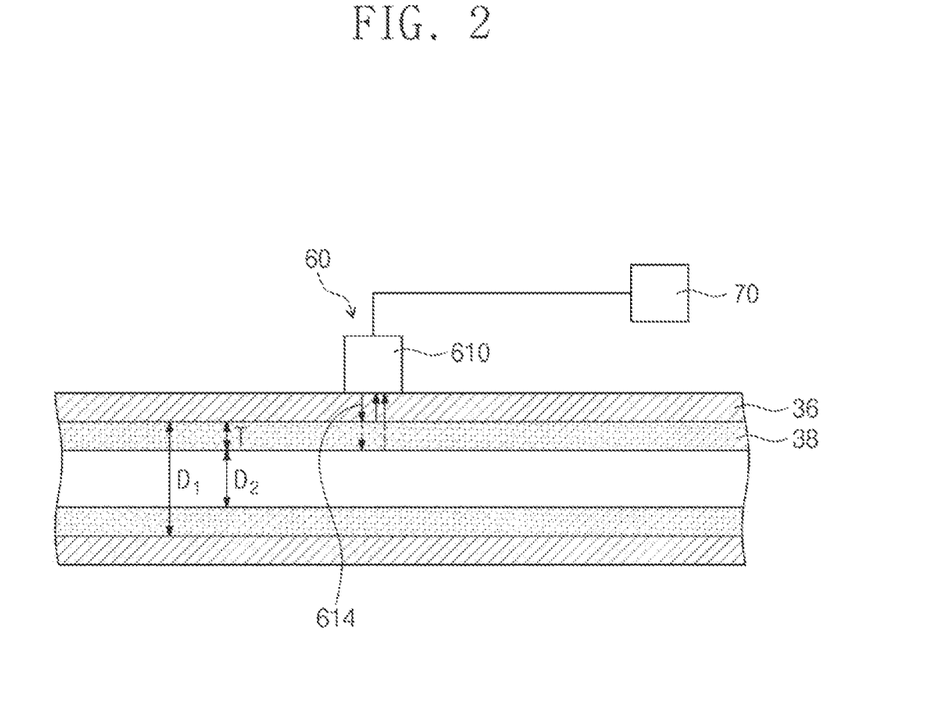
FIG. 2 illustrates a cross-sectional view showing an example of a thickness detection apparatus illustrated in FIG. 1.

FIG. 2 shows an example of the thickness detection apparatus 60 illustrated in FIG. 1.

Referring to FIG. 2, the thickness detection apparatus 60 may include a first thickness detector 610. The first thickness detector 610 may be arranged on the exhausting line 36 and in a direction vertical with respect to a direction in which the exhausting line 36 extends. The first thickness detector 610 may transmit and receive a first ultrasonic wave 614 with the exhausting line 36. For example, the first thickness detector 610 may include a piezoelectric element. The first ultrasonic wave 614 may be transmitted in a direction perpendicular to the direction in which the exhausting line 36 extends, and the first thickness detector 610 may receive the first ultrasonic wave 614. The first ultrasonic wave 614 may have a reflectance rate, a transmittance rate, and an attenuation rate that are changed based on materials of the exhausting line 36 and the byproduct layer 38. The first ultrasonic wave 614 may have a frequency of about 1 MHz to about 40 MHz. The byproduct layer 38 may be a powder layer, but the present inventive concepts are not limited thereto.

Figure 3:
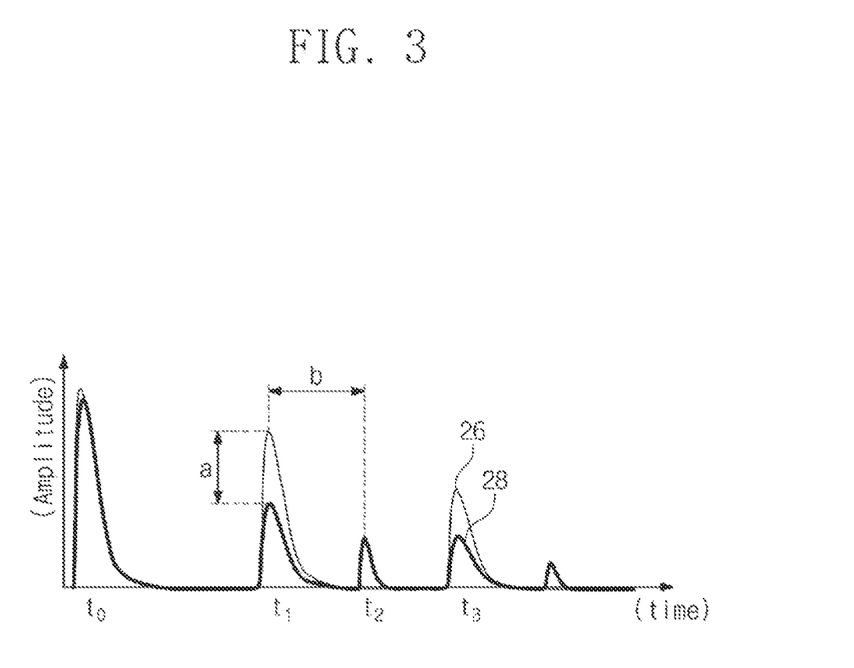
FIG. 3 illustrates a graph showing a variation in first ultrasonic wave illustrated in FIG. 2.

FIG. 3 illustrates a graph showing a variation in the first ultrasonic wave 614 illustrated in FIG. 2.

Referring to FIG. 3, when the byproduct layer 38 is induced in the exhausting line 36, the attenuation rate a of the first ultrasonic wave 614 may increase. The byproduct layer 38 may absorb a portion of the first ultrasonic wave 614 to increase the attenuation rate a of the first ultrasonic wave 614. The attenuation rate a may be a difference in amplitude between a reference value 26 and a measured value 28. The thickness T of the byproduct layer 38 may be proportional to a detection time difference b of the first ultrasonic wave 614 as shown in Equation 1 below.

$$T = v(t2-t1)/2 \quad \text{[Equation 1]}$$

Here, v is a velocity of the first ultrasonic wave 614 in the byproduct layer 38, t1 is a detection time at a first peak, and t2 is a detection time at a second peak.

The detection time difference b may be a difference in detection time of the measured value 28.

Referring to FIGS. 1 to 3, the controller 70 may use the attenuation rate a and the detection time difference b of the first ultrasonic wave 614 to ascertain the occurrence of the byproduct layer 38 and to calculate the thickness T of the byproduct layer 38. The controller 70 may compare a threshold value and the thickness T of the byproduct layer 38 with each other to display preventive maintenance of the exhausting line 36. An engineer may execute the preventive maintenance on the exhausting line 36. When the exhausting line 36 has a first inner diameter D1 of about 50 mm, and when the byproduct layer 38 has a second inner diameter of about 25 mm, the preventive maintenance may be performed such that the exhausting line 36 is wet-etched or changed with new exhausting line. The threshold value may be about a quarter of the first inner diameter D1. For example, the threshold value may be about 12.5 mm. However, embodiments are not limited thereto.

Figure 4:
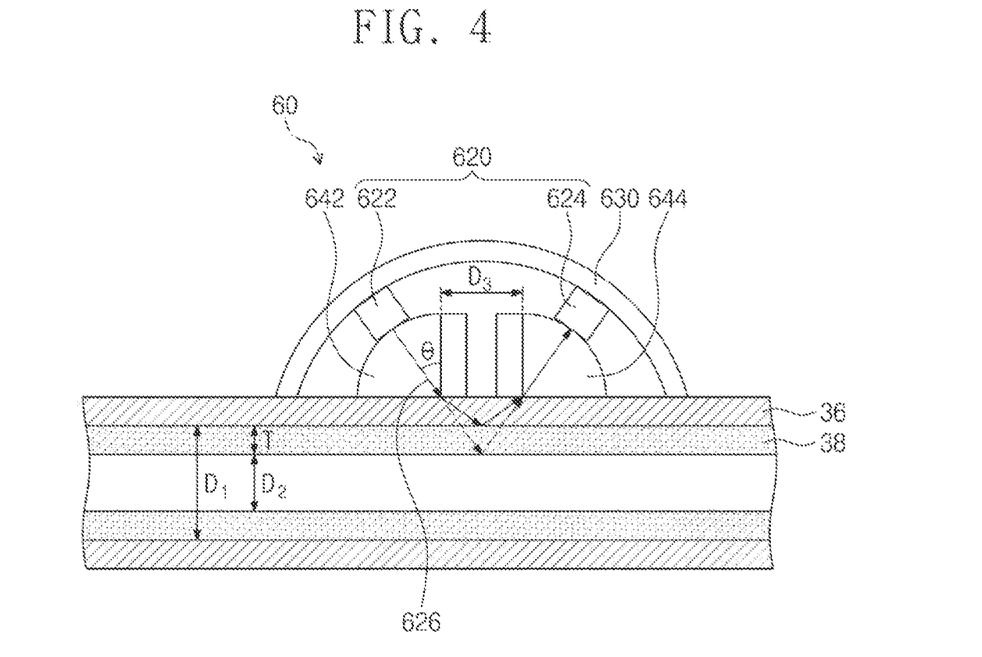
FIG. 4 illustrates a cross-sectional view showing an example of a thickness detection apparatus illustrated in FIG. 1.

FIG. 4 shows an example of the thickness detection apparatus 60 illustrated in FIG. 1.

Referring to FIGS. 1 and 4, the thickness detection apparatus 60 may include a second thickness detector 620, an outer jig 630, a first inner jig 642, and a second inner jig 644.

The second thickness detector 620 may be a detector inclined at an angle with respect to the direction in which the exhausting line 36 extends. The second thickness detector 620 may be provided between the outer jig 630 and the first inner jig 642. In addition, the second thickness detector 620 may be provided between the outer jig 630 and the second inner jig 644. The second thickness detector 620 may move along outer sidewalls of the first and second inner jigs 642 and 644. The second thickness detector 620 may use a second ultrasonic wave 626 to detect the thickness T of the byproduct layer 38. The second ultrasonic wave 626 may be the same as the first ultrasonic wave 614 of FIG. 2. The controller 70 may use an attenuation rate a and a detection time difference b of the second ultrasonic wave 626 to ascertain the occurrence of the byproduct layer 38 and to calculate the thickness T of the byproduct layer 38. For example, the second thickness detector 620 may include a piezoelectric element, but embodiments are not limited thereto. According to an embodiment, the second thickness detector 620 may include a sloped transmitter 622 and a sloped receiver 624.

The sloped transmitter 622 may be provided between the outer jig 630 and the first inner jig 642. The sloped transmitter 622 may provide the second ultrasonic wave 626 to the first inner jig 642 and the exhausting line 36. The sloped transmitter 622 may be inclined at an angle with respect to a top surface of the exhausting line 36. The second ultrasonic wave 626 may be reflected from a bottom surface of the byproduct layer 38.

The sloped receiver 624 may be provided between the outer jig 630 and the second inner jig 644. The sloped receiver 624 may be inclined at an angle with respect to the top surface of the exhausting line 36, in which the inclined angle is the same as the angle at which the sloped transmitter 622 is inclined with respect to the top surface of the exhausting line 36. The sloped receiver 624 may receive the second ultrasonic wave 626 through the second inner jig 644 and the exhausting line 36. The sloped receiver 624 may generate a detection signal of the second ultrasonic wave 626.

The sloped transmitter 622 and the sloped receiver 624 may increase reception efficiency of the second ultrasonic wave 626, while departing from each other or approaching each other along the first inner jig 642 and the second inner jig 644. When the reception efficiency of the second ultrasonic wave 626 increases to maximum, the controller 70 may determine positions of the sloped transmitter 622 and the sloped receiver 624.

The outer jig 630 may be disposed outside the first inner jig 642, the second inner jig 644, the sloped transmitter 622, and the sloped receiver 624. The sloped transmitter 622 and the sloped receiver 624 may move along an inner wall of the outer jig 630. For example, the outer jig 630 may have an arc shape.

The first inner jig 642 may be disposed between the sloped transmitter 622 and the exhausting line 36. The first inner jig 642 may transmit the second ultrasonic wave 626 to a location between the sloped transmitter 622 and the exhausting line 36. The first inner jig 642 may have a fan shape. The sloped transmitter 622 may move along an outer wall of the first inner jig 642, and may provide the second ultrasonic wave 626 at an incidence angle θ with respect to the exhausting line 36. The incidence angle θ may be an angle generated from a vertical line on the top surface of the exhausting line 36. For example, the incidence angle θ of the second ultrasonic wave 626 may range from about 0° to about 22°. The first inner jig 642 may include the same material as that of the exhausting line 36. For example, the first inner jig 642 may include metal, such as, for example, stainless steel (SUS) or polymer, but embodiments are not limited thereto.

The second inner jig 644 may be disposed between the sloped receiver 624 and the exhausting line 36. The second inner jig 644 may transmit the second ultrasonic wave 626 to a location between the sloped receiver 624 and the exhausting line 36. The second inner jig 644 may have a shape symmetrical to that of the first inner jig 642. The second inner jig 644 may have a fan shape. The sloped receiver 624 may move along an outer wall of the second inner jig 644, and may receive the second ultrasonic wave 626 at a reflection angle relative to the exhausting line 36. The reflection angle may be the same as the incidence angle θ. The reflection angle of the second ultrasonic wave 626 may be an angle generated from a vertical line on the top surface of the exhausting line 36. For example, the reflection angle of the second ultrasonic wave 626 may range from about 0° to about 22°. The second inner jig 644 may include the same material as that of the first inner jig 642. For example, the second inner jig 644 may include metal, such as stainless steel (SUS) or polymer. There may be adjusted a distance D3 between the first inner jig 642 and the second inner jig 644. According to another embodiment, the first inner jig 642 and the second inner jig 644 may be coupled to each other, but embodiments are not limited thereto.

Figure 5:
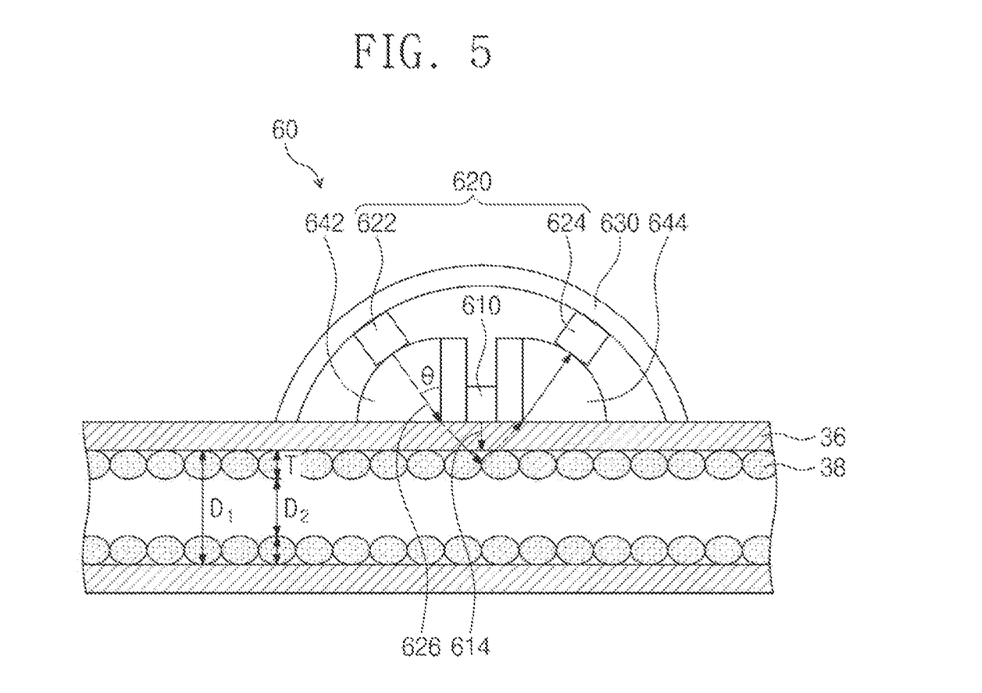
FIG. 5 illustrates a cross-sectional view showing an example of a thickness detection apparatus illustrated in FIG. 1.

FIG. 5 shows an example of the thickness detection apparatus 60 illustrated in FIG. 1.

Referring to FIGS. 1 and 5, the thickness detection apparatus 60 may include a first thickness detector 610 and a second thickness detector 620.

The first thickness detector 610 may be provided between the first inner jig 642 and the second inner jig 644. The first thickness detector 610 may use the first ultrasonic wave 614 to detect the thickness T of the byproduct layer 38. The first ultrasonic wave 614 may be transmitted or received in a direction perpendicular to the exhausting line 36 and the byproduct layer 38. When the byproduct layer 38 is not flat, the first thickness detector 610 may decrease in thickness detection reliability. The byproduct layer 38 may be divided into a plurality of grains. The byproduct layer 38 may have an uneven bottom surface. In this case, the first ultrasonic wave 614 may not approach the byproduct layer 38. In addition, the first ultrasonic wave 614 may be scattered and reflected from the bottom surface of the byproduct layer 38.

The second thickness detector 620 may be provided between the outer jig 630 and the first inner jig 642. In addition, the second thickness detector 620 may be provided between the outer jig 630 and the second inner jig 644. The second thickness detector 620 may use the second ultrasonic wave 626 to re-detect the thickness T of the byproduct layer 38. The second thickness detector 620 may increase thickness detection reliability of the non-flat byproduct layer 38. The sloped transmitter 622 of the second thickness detector 620 may obliquely provide the second ultrasonic wave 626 to the exhausting line 36 and the byproduct layer 38. The second ultrasonic wave 626 may be reflected from the bottom surface of the byproduct layer 38 and may be collected through the exhausting line 36. The sloped receiver 624 of the second thickness detector 620 may receive the second ultrasonic wave 626.

The controller 70 may use detection signals of the first and second thickness detectors 610 and 620 to determine and verify the thickness T of the byproduct layer 38. The controller 70 may display that the byproduct layer 38 is not flat. When the thickness T of the byproduct layer 38 is greater than a threshold value, the controller 70 may display preventive maintenance of the exhausting line 36. An engineer may execute the preventive maintenance on the exhausting line 36 to increase operating reliability of a semiconductor fabrication facility.

Figure 6:
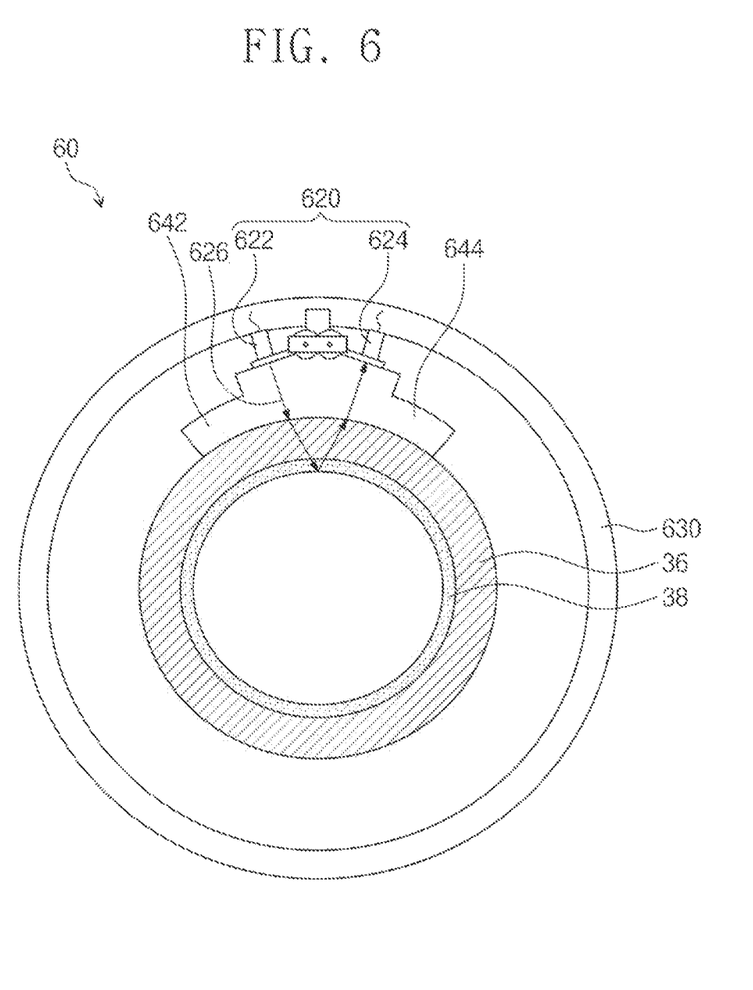
FIG. 6 illustrates a cross-sectional view showing an example of a thickness detection apparatus illustrated in FIG. 1.

FIG. 6 shows an example of the thickness detection apparatus 60 illustrated in FIG. 1.

Referring to FIG. 6, the second thickness detector 620 may be disposed along a circumference of the exhausting line 36. The second thickness detector 620 may be arranged in a circumferential direction at a cross section of the exhausting line 36.

The outer jig 630 may be disposed outside the exhausting line 36 and the second thickness detector 620. The outer jig 630 may have a cross section that is the same as a cross section of the exhausting line 36. For example, the exhausting line 36 and the outer jig 630 may have a ring shape.

The first inner jig 642 and the second inner jig 644 may be connected to each other. The first inner jig 642 and the second inner jig 644 may have a stepped mountain shape or a stepped island shape. The sloped transmitter 622 and the sloped receiver 624 of the second thickness detector 620 may move along the first inner jig 642 and the second inner jig 644. The sloped transmitter 622 and the sloped receiver 624 may increase reception efficiency of the second ultrasonic wave 626, while departing from each other or approaching each other.

As discussed above, a semiconductor fabrication facility according to some embodiments may be configured such that a thickness detection apparatus is used to detect a thickness of a byproduct layer on an inner wall of an exhausting line, and that preventive maintenance of the exhausting line is displayed to execute the preventive maintenance.

While the present disclosure has been described with reference to embodiments thereof, it will be apparent to those of ordinary skill in the art that various changes and modifications may be made thereto without departing from the spirit and scope of the present disclosure as set forth in the following claims and their equivalents.

What is claimed is:

1. A semiconductor fabrication facility, comprising:
   a chamber;
   a gas supply configured to provide reaction gas to the chamber;
   a plurality of vacuum pumps respectively configured to pump the reaction gas from the chamber;
   an exhaust apparatus that is connected to the plurality of vacuum pumps and configured to purify the reaction gas;
   an exhausting line between the exhaust apparatus and the plurality of vacuum pumps;
   a thickness detection apparatus connected to the exhausting line and configured to detect a thickness of a byproduct layer in the exhausting line; and
   a processor connected to the thickness detection apparatus and configured to display preventive maintenance of the exhausting line based on the thickness of the byproduct layer being greater than a threshold value,
   wherein the thickness detection apparatus comprises a first thickness detector configured to detect the thickness of the byproduct layer based on a first ultrasonic wave.

2. The semiconductor fabrication facility of claim 1, wherein the first thickness detector is provided in a direction perpendicular to a direction in which the exhausting line extends.

3. The semiconductor fabrication facility of claim 2, wherein the thickness detection apparatus further comprises a second thickness detector provided in a direction inclined with respect to the direction in which the exhausting line extends, the second thickness detector being configured to detect the thickness of the byproduct layer based on a second ultrasonic wave.

4. The semiconductor fabrication facility of claim 3, wherein the second thickness detector comprises:
   a sloped transmitter provided in a direction inclined with respect to a top surface of the exhausting line, the sloped transmitter being configured to transmit the second ultrasonic wave into the exhausting line; and
   a sloped receiver adjacent to the sloped transmitter and provided in the direction inclined with respect to the top surface of the exhausting line, the sloped receiver being configured to receive the second ultrasonic wave.

5. The semiconductor fabrication facility of claim 4, wherein the thickness detection apparatus comprises:
   a first inner jig between the exhausting line and the sloped transmitter; and a second inner jig between the exhausting line and the sloped receiver.

6. The semiconductor fabrication facility of claim 5, wherein each of the first inner jig and the second inner jig has a fan shape.

7. The semiconductor fabrication facility of claim 5, wherein the first inner jig and the second inner jig have a stepped mountain shape.

8. The semiconductor fabrication facility of claim 5, wherein the first thickness detector is between the first inner jig and the second inner jig.

9. The semiconductor fabrication facility of claim 4, wherein the thickness detection apparatus further comprises an outer jig outside the sloped transmitter and the sloped receiver.

10. The semiconductor fabrication facility of claim 9, wherein the outer jig has an arc shape or a ring shape.

11. A semiconductor fabrication facility, comprising:
a chamber;
a gas supply configured to provide reaction gas to the chamber;
a high-vacuum pump connected to the chamber;
a low-vacuum pump connected to the high-vacuum pump;
a foreline connecting the low-vacuum pump and the high-vacuum pump to the chamber;
a roughing line connecting the low-vacuum pump to the chamber;
an exhaust apparatus connected to the low-vacuum pump and configured to purify the reaction gas;
an exhausting line between the exhaust apparatus and the low-vacuum pump;
a thickness detection apparatus connected to the exhausting line and configured to detect a thickness of a byproduct layer in the exhausting line; and
a processor connected to the thickness detection apparatus and configured to display preventive maintenance of the exhausting line based on the thickness of the byproduct layer being greater than a threshold value,
wherein the thickness detection apparatus is configured to detect the thickness of the byproduct layer based on a first ultrasonic wave.

12. The semiconductor fabrication facility of claim 11, wherein an inner diameter of the exhausting line is 50 mm, and
wherein the threshold value is 12.5 mm.

13. The semiconductor fabrication facility of claim 11, wherein the thickness detection apparatus comprises a first thickness detector provided in a direction perpendicular to a direction in which the exhausting line extends.

14. The semiconductor fabrication facility of claim 13, wherein the thickness detection apparatus further comprises a second thickness detector provided in a circumferential direction at a cross section of the exhausting line.

15. The semiconductor fabrication facility of claim 14, wherein the thickness detection apparatus further comprises:

an outer jig outside the second thickness detector and having a shape that is the same as a shape of the cross section of the exhausting line; and
a first inner jig and a second inner jig between the second thickness detector and the exhausting line and having a stepped mountain shape.

16. A semiconductor fabrication facility, comprising:
a chamber comprising a showerhead;
a gas supply connected to the showerhead and configured to provide reaction gas to the chamber;
an exhaust apparatus configured to exhaust and purify the reaction gas;
an exhausting line between the exhaust apparatus and the chamber; and
a thickness detection apparatus connected to the exhausting line and configured to detect a thickness of a byproduct layer in the exhausting line,
wherein the thickness detection apparatus comprises:
a first thickness detector provided in a direction perpendicular to a direction in which the exhausting line extends, the first thickness detector being configured to provide the exhausting line with a first ultrasonic wave to detect the thickness of the byproduct layer; and
a second thickness detector provided on a side of the exhausting line opposite to the first thickness detector, the second thickness detector being configured to provide the exhausting line with a second ultrasonic wave to re-detect the thickness of the byproduct layer.

17. The semiconductor fabrication facility of claim 16, wherein each of the first thickness detector and the second thickness detector comprises a piezoelectric element.

18. The semiconductor fabrication facility of claim 16, wherein the second thickness detector comprises:
a sloped transmitter provided in a direction inclined with respect to a direction in which the exhausting line extends, the sloped transmitter being configured to provide the second ultrasonic wave to the exhausting line; and
a sloped receiver opposite to the sloped transmitter and provided in the direction inclined with respect to the direction in which the exhausting line extends, the sloped receiver being configured to receive the second ultrasonic wave.

19. The semiconductor fabrication facility of claim 18, wherein the thickness detection apparatus further comprises:
a first inner jig between the sloped transmitter and the exhausting line; and
a second inner jig between the sloped receiver and the exhausting line.

20. The semiconductor fabrication facility of claim 18, wherein the thickness detection apparatus further comprises an outer jig outside the sloped transmitter and the sloped receiver.

* * * * *